United States Patent
Guo et al.

(10) Patent No.: US 12,379,736 B1
(45) Date of Patent: Aug. 5, 2025

(54) CONFIGURABLE POWER MONITORING SYSTEM FOR ELECTRONIC DEVICES

(71) Applicant: Amazon Technologies, Inc., Seattle, WA (US)

(72) Inventors: Linfei Guo, South San Francisco, CA (US); Mahesh Hooli, San Jose, CA (US); Sagnik Kar, San Jose, CA (US); Avinash Hosamalangi Mahadeva, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 293 days.

(21) Appl. No.: 18/137,247

(22) Filed: Apr. 20, 2023

(51) Int. Cl.
*G05F 1/56* (2006.01)
*G06F 1/28* (2006.01)
*H03M 1/12* (2006.01)

(52) U.S. Cl.
CPC ............... *G05F 1/56* (2013.01); *G06F 1/28* (2013.01); *H03M 1/12* (2013.01)

(58) Field of Classification Search
CPC ............ G05F 1/56; G06F 1/28; H03M 1/12
See application file for complete search history.

(56) References Cited

U.S. PATENT DOCUMENTS

| | | | |
|---|---|---|---|
| 5,053,757 A * | 10/1991 | Meadows | G06F 3/0442 345/173 |
| 10,103,639 B2 * | 10/2018 | Jitaru | H02M 3/33576 |
| 2008/0150500 A1 * | 6/2008 | Gurcan | H02M 3/156 323/283 |
| 2017/0212154 A1 * | 7/2017 | Otsuka | F16D 48/064 |

* cited by examiner

*Primary Examiner* — Lee E Rodak
*Assistant Examiner* — Zannatul Ferdous
(74) *Attorney, Agent, or Firm* — Kilpatrick Townsend & Stockton LLP

(57) ABSTRACT

A configurable power monitoring system for electronic devices is described herein. In an example, a device can include a first circuit that can receive a first voltage signal from a voltage bus and output a second voltage signal that is lower than the first voltage signal. An electronic system can be coupled to the voltage bus. A second circuit can be coupled to the electronic system and can output a third voltage signal corresponding to current flow through the electronic system. An amplifier can amplify the third voltage signal to generate an amplified voltage signal. An accumulator can determine a power consumption value of the electronic system based on the second voltage signal and the amplified voltage signal. A data communication system can transmit the power consumption value to the electronic system and can receive configuration data usable to adjust an accuracy and/or a dynamic sensing range of the device.

20 Claims, 9 Drawing Sheets

CONFIGURABLE POWER MONITORING SYSTEM FOR ELECTRONIC DEVICES

BACKGROUND

Electronic devices have been widely used in various products. Generally, an electronic device is a computing device that receives power from a power source for supplying power to various components of the computing device. These components are configured to provide different functionalities. Systems to monitor power consumption of components in the electronic devices have been developed. Power monitoring systems can provide power consumption reporting, device consumption characteristics, etc. Despite the progress made in the area of power monitoring in electronic devices, there is a need in the art for improved methods and systems related to power monitoring.

DETAILED DESCRIPTION

Figure 1:
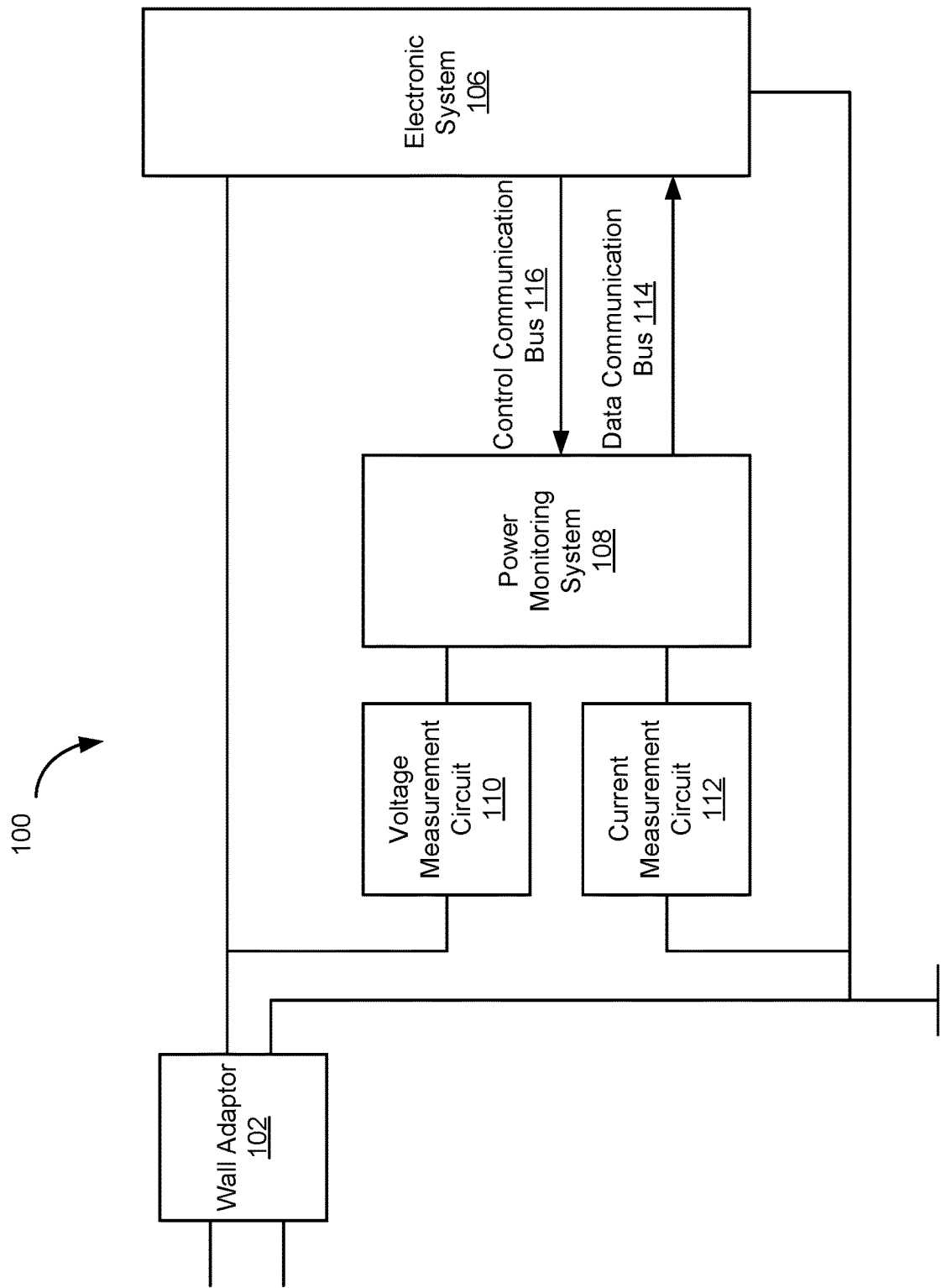
FIG. 1 illustrates an example of a device including a configurable power monitoring system, according to some embodiments of the present disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the present disclosure are directed to, among other things, a power monitoring system that can be utilized with a variety of electronic systems. In an example, the power monitoring system measures system voltage and current and computes system power. The measurement resolution and accuracy can be configurable and updated or optimized based on a power state determined from the system power. As the electronic system transitions to different power states, the measurement resolution and accuracy can be dynamically reconfigured. As a result, the embodiments described herein provide methods and systems that enable continuous measurement and reporting of power consumed by an electronic system.

To illustrate, consider an example of a multi-media device plugged into an electrical outlet that provides power to the multi-media device. The multi-media device can include various electronics such as a speaker and display that consume the power provided by the electrical outlet. The power consumption of the electronics can be monitored and dynamically controlled using a power monitoring system in the multi-media device. For example, the multi-media device can include a voltage divider that reduces a voltage received from the electrical outlet to a reduced voltage signal. Additionally, the power monitoring system can include an amplifier that can amplify a voltage signal measured by a current sensor resistor connected to the electronics. The amplified voltage signal can correspond to a current load for the electronics. The amplified voltage signal, along with the reduced voltage signal corresponding to the voltage present on the voltage bus, can be sampled by an analog-to-digital converter. The analog-to-digital converter can switch between sampling current information and voltage information, which can be used to calculate system power for the electronics. The power monitoring system can transmit the system power to a power observer service (e.g., a system-on-a-chip) in the electronics. The power observer service can use the system power to determine a power state of the multi-media device.

For example, the power observer service may determine that the multi-media device may be in a high-power state due to outputting video on the display while outputting audio on the speaker at a high volume. Because the multi-media device is in a high-power state, it may be beneficial to adjust a gain of the amplifier to increase a sensing range for the system power while reducing the resolution. Thus, the power observer service can send a command to the power monitoring system to adjust the gain of the amplifier accordingly. Additionally or alternatively, the power observer service can send a command to the power monitoring system to adjust a sampling rate of the analog-to-digital converter. The gain and/or sampling rate may be adjusted at a later time if the system power detected by the power monitoring system has decreased enough for the power observer service to determine that the electronics are in a low-power state (e.g., remaining idle). For example, the gain may be decreased, resulting in the sensing range being decreased while the resolution is increased.

Embodiments of the present disclosure provide several technical advantages compared to conventional power monitoring systems in electronic devices. It can be difficult to achieve fine resolution combined with a large sensing range using fixed hardware. For instance, it may be challenging to design a current measurement circuit with a 10 mΩ sense resistor to accurately sense both a 1 mA current and a 6 A current. In contrast, embodiments of the present disclosure can circumvent undesirable trade-offs between accuracy and sensing range by dynamically tuning the gain of a current measurement circuit. The gain can be algorithmically tuned depending on the power state and/or the power consumption reading. Furthermore, the gain can also be tuned based on measurements made by the power monitoring system, including values stored in registers and provided to the electronic system. If the use of higher gain value leads to saturation of the output of an analog-to-digital converter utilized in the power monitoring system (e.g., indicated by a register using most available bits), a smaller gain can be selected. Thus, the power monitoring system can allow an electronic device to dynamically adjust accuracy and/or dynamic sensing range of the power monitoring system based on the operational parameters of the electronic device at particular times. For example, in low power operating conditions, the power monitoring system can adjust the gain to a high gain value in order to provide relatively high resolution/accuracy with a reduced sensing range. Alternatively, in high power operating conditions, the power monitoring system can adjust the gain to a low gain value in order to provide a relatively high sensing range with reduced resolution/accuracy. Similarly, sampling duration and sampling rate can also be adjusted based on the configuration data provided by the electronic device.

Additionally, because embodiments of the present disclosure include a current measurement circuit positioned on the "low side" (e.g., on the ground side of the circuit rather than on the input voltage side), the power monitoring system is not required to use interfacing devices that are high-voltage rated. Embodiments of the present disclosure can be implemented using low-voltage rated devices, such as 1.8 V devices. The low-voltage rated devices are typically superior to high-voltage rated devices in terms of speed, variances, power consumption, and accuracy. This further allows the integration of the power monitoring function into power-management integrated circuitry for the device, which, in turn, can simplify the system level connections between electronics in the device and other power integrated circuits.

FIG. 1 illustrates an example of a device including a configurable power monitoring system, according to some embodiments of the present disclosure. The device 100 can be powered by a wall adapter 102, such as an alternating current/direct current power supply, that can receive power from an electrical outlet. Depending on the power and voltage requirements of the device 100, the voltage output by the wall adapter 102 can range from 5 V to 18 V or higher. For example, a multi-media device can feature a 15/18 V wall adapter output due to the large power required during high-power operations. The device 100 can include an electronic system 106, which can include a system-on-a-chip and any peripherals (not shown) of the device 100. The peripherals may include a microphone, a speaker, a display, a network interface card, etc. The wall adapter 102 can provide power from the electrical outlet to the electronic system 106.

The device 100 can also include a power monitoring system 108 to monitor power consumption of the electronic system 106. The power monitoring system 108 can determine power consumption by measuring voltage and current in the device 100. For example, the device 100 can include a voltage measurement circuit 110 and a current measurement circuit 112 that are each connected to the power monitoring system 108. The voltage measurement circuit 110 can receive a first voltage signal from the wall adapter 102 on the high-side (e.g., on the input voltage side rather than on the ground side). The voltage measurement circuit 110 can reduce the first voltage signal and output a second voltage signal. For example, the second voltage signal may be 1.8 V. The current measurement circuit 112 can be connected to the electronic system 106 on the ground side and can output a third voltage signal that corresponds to the current that flows through the electronic system 106. The power monitoring system 108 can use the second voltage signal from the voltage measurement circuit 110 and the third voltage signal from the current measurement circuit 112 to determine the power consumption of the electronic system 106. The power monitoring system 108 can transmit power consumption values to the electronic system 106 via a data communication bus 114.

The power monitoring system 108 can monitor power consumption for different configurations and configure the gain and/or the sampling rate of the power monitoring system 108. For example, the measurement systems can be operated at different gains and/or sampling rates as a function of the configuration. This ability to configure the gain and/or sampling rates enables the system to control the sensing range and the accuracy (e.g., the resolution) that are used to measure the power consumption. The configuration may be adjusted based on the load of the electronic system 106. For example, the electronic system 106 may use the measured power consumption from the power monitoring system 108 to determine a power state for the device 100. Power states can be predefined states that represent different operating modes for the device 100. Thus, embodiments enable the configuration of the power monitoring system 108 to be adjusted in order to measure power consumption using different sensing ranges or different levels of accuracy for different power states.

In an example, the power states defined for the device 100 can include an ultra-low power state, a low-power state, a medium-power state, an active medium-power state, and a high-power state. The ultra-low power state can involve the device 100 operating in a suspended mode. Most of the systems in the device can be shut down, and a system-on-a-chip in the electronic system 106 can be off or suspended. The low-power state can involve the device 100 operating in a night-time mode. For example, the display may be off and the system-on-a-chip may be running at a low frequency. The medium-power state may involve the device 100 operating in an idle or day-time mode. The device 100 may display a clock, but no user presence may be detected. The active medium-power state can involve the device 100 operating in an active-idle mode. For example, a user may interact with the device 100. Alternatively, a microphone and a language processing unit in the device 100 may be active. The display may display static pictures such as a weather update, news, or photo frames. The high-power state may involve the device 100 operating in an active-use mode. The device 100 may play music or video or the user may actively interact with the device 100 using multimedia applications. Other devices may have different defined power states or use a range of values (e.g., 0-100) to represent the power state of the electronic system.

After the electronic system 106 determines the power state of the device 100, the electronic system 106 may determine an adjustment to a configuration of the power monitoring system 108. For example, each power state may be associated with a particular gain and/or sampling rate setting. The electronic system 106 can transmit configuration data indicating the adjustment to the power monitoring system 108 via a control communication bus 116. The power monitoring system 108 can make the adjustment based on the configuration data. For example, the electronic system 106 may determine that the device 100 is operating in an ultra-low power state and may transmit configuration data to the power monitoring system 108. The power monitoring system 108 may reduce a gain utilized in conjunction with current measurements based on the configuration data. This gain reduction can increase a sensing range for power consumption but decrease the measurement accuracy.

Figure 2:
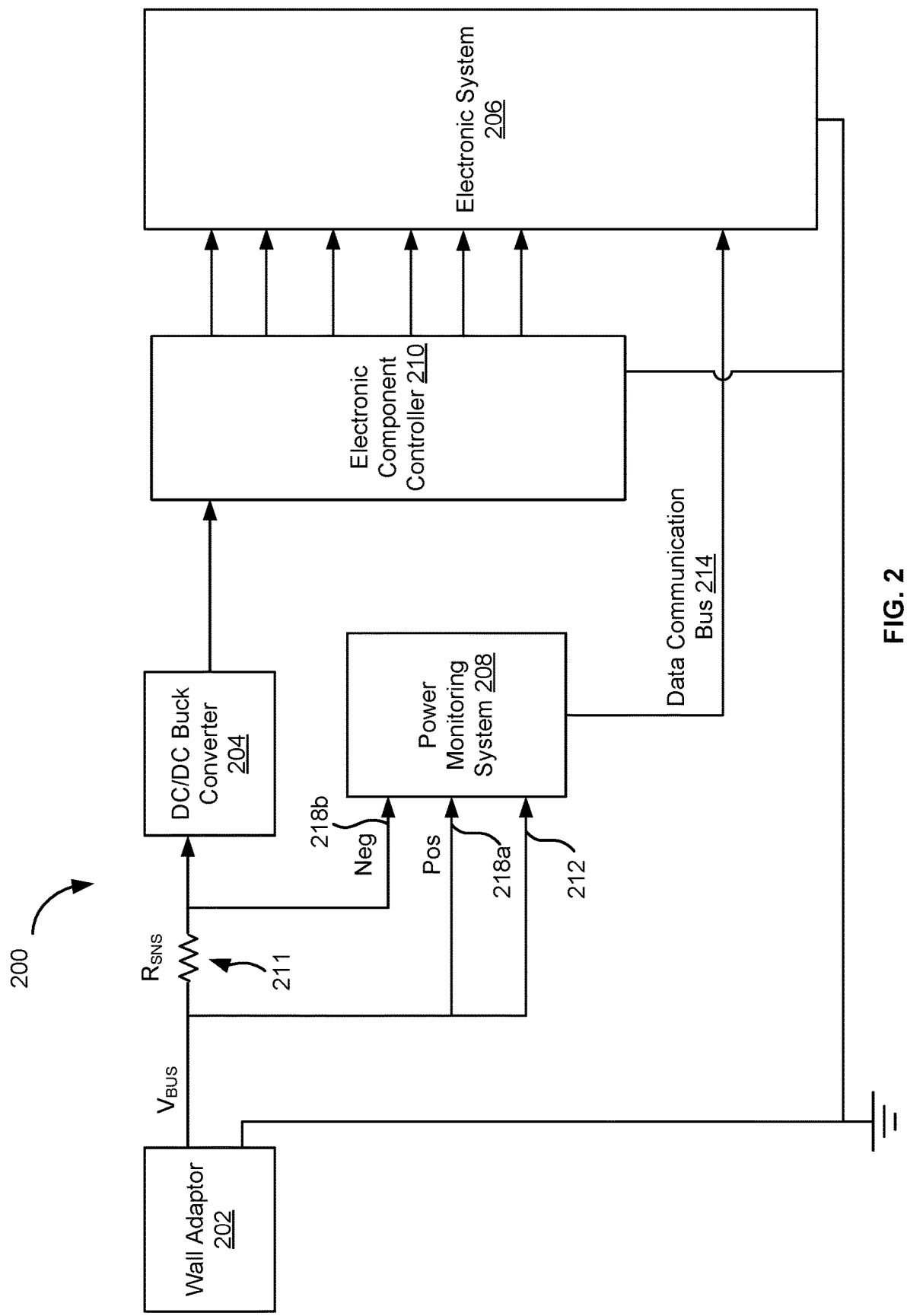
FIG. 2 illustrates an example of a circuit implementation for a device, according to some embodiments of the present disclosure.

FIG. 2 illustrates an example of a circuit implementation for a device 200, according to some embodiments of the present disclosure. The device 200 can be powered by a wall adapter 202 such as an alternating current/direct current (AC/DC) power supply that can receive an alternating current (AC) signal from an electrical outlet and produce a direct current (DC) signal on the voltage bus $V_{BUS}$. For example, the wall adapter 202 may power a voltage bus outputting 15 V. The device 200 can also include a direct current-to-direct current (DC-to-DC) buck converter 204. The DC-to-DC buck converter 204, which can also be referred to as a step-down converter, is a DC-to-DC converter that steps down the voltage, while stepping up the current, from an input voltage (i.e., a supply voltage) to an output voltage (i.e., a load voltage). Thus, the DC-to-DC buck converter 204 can provide a reduced second voltage signal to an electronic component controller 210. For example, the DC-to-DC buck converter 204 can receive a first voltage signal of 15 V and produce a second voltage signal of 3.8 V. The electronic component controller 210 can deliver the second voltage signal supplied by the DC-to-DC buck converter 204 to various electronics within an electronic system 206 and peripherals utilized in conjunction with the electronic system 206. In some embodiments, peripherals can be considered as elements of electronic system 206. The power consumption of the electronic system 206 can be monitored by a power monitoring system 208. The power monitoring system 208 can measure current for the electronic system 206 via a current sense resistor 211 and can measure voltage for the electronic system 206 via voltage sensing lead 212. The power monitoring system 208 can determine power consumption of the electronic system 206 using the current and voltage, for example, by multiplying the current consumed by the electronic system 206 times the voltage at which the electronic system 206 is operating. The power monitoring system 208 can then transmit the power consumption to the electronic system 206 via a data communication bus 214.

The power monitoring system 208 may be implemented in a "high-side" configuration (e.g., measuring the first voltage signal and the input current by measuring the voltage on the voltage bus $V_{BUS}$ and the current flowing through current sense resistor 211 connected to voltage bus $V_{BUS}$, respectively). In this high-side configuration, the voltage and current are referenced to the voltage bus $V_{BUS}$. For example, the current sense resistor 211 may have a first end connected to a positive current lead 218a and a second end connected to a negative current lead 218b that measure current flow between the wall adapter 202 and the DC-to-DC buck converter 204, with the positive current lead 218a being connected to the voltage bus $V_{BUS}$. The voltage drop across the current sense resistor 211 may be used to compute the current flow through current sense resistor 211. The voltage sensing lead 212 may also be connected to the voltage bus $V_{BUS}$ in this high-side voltage measurement configuration and used to measure the voltage on the voltage bus $V_{BUS}$.

The power monitoring system 208 may also be statically configured. That is, the power monitoring system 208 may transmit power consumption values to the electronic system 206, but the electronic system 206 may not dynamically adjust configuration of the power monitoring system 208 based on the power consumption values. In this configuration, the current-sensing accuracy, the current-sensing dynamic range, the sampling rate, and the total number of samples that can be stored before running out of storage are fixed in run-time. Some metrics, such as current-sensing accuracy and current-sensing dynamic range, are often competing parameters, since improving one may undesirably degrade the other.

Figure 3:
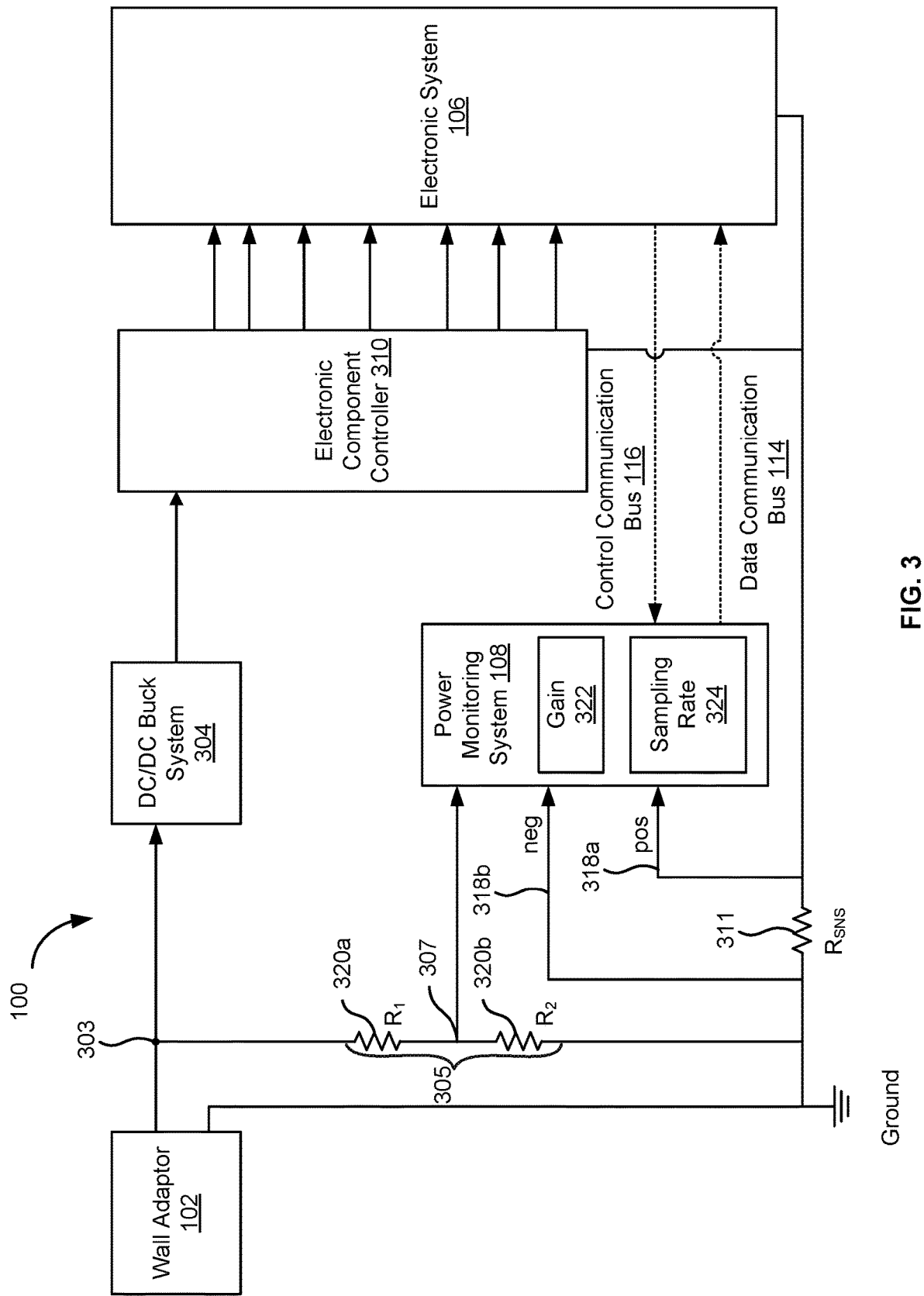
FIG. 3 illustrates an example of a circuit implementation of the configurable power monitoring system for the device, according to some embodiments of the present disclosure.

FIG. 3 illustrates an example of a circuit implementation of the configurable power monitoring system for the device 100 of FIG. 1, according to some embodiments of the present disclosure. As illustrated, the device 100 includes multiple components, such as a voltage bus $V_{BUS}$ 303 connected to a wall adapter 102, a DC-to-DC buck converter 304, an electronic system 106, a voltage divider 305, a power monitoring system 108, an electronic component controller 310, a current sense resistor 311, a data communication bus 114, and a control communication bus 116.

The wall adapter 102, such as an AC/DC power supply, can receive power from an electrical outlet. The electrical outlet may supply an AC signal and the wall adapter 102 can convert the AC signal received from the electrical outlet to a DC signal. The wall adapter 102 can output a voltage, such as a voltage ranging from 12 V to 18 V, on the voltage bus $V_{BUS}$ 303. The DC-to-DC buck converter 304 can step down the voltage on the voltage bus $V_{BUS}$ 303 to produce a reduced voltage that is supplied to the electronic component controller 310. In some examples, the DC-to-DC buck converter 304 can provide a voltage of 3.8 V to the electronic component controller 310. This voltage can power the electronic system 106. For example, the electronic component controller 310 can deliver the voltage supplied by the DC-to-DC buck converter 304 to various electronic components within the electronic system 106 or coupled to the electronic system 106.

The power monitoring system 108 may be implemented in a "low-side" configuration (e.g., measuring the input voltage and the input current by measuring the voltage and the current referenced to system ground). In this low-side configuration, the voltage and current are referenced to system ground, also referred to as ground, rather than to the voltage bus $V_{BUS}$. Thus, the power monitoring system 108 can monitor power consumption of the electronic system 106 by detecting current flowing to ground. For example, the current sense resistor 311 may have a first end connected to a positive current lead 318a and the electronic system 106 and a second end connected to a negative current lead 318b and ground in order to measure the current that flows through the electronic system 106. The voltage drop across the current sense resistor 311 may be used to compute the current flow through current sense resistor 311.

The power monitoring system 108 may utilize a voltage divider to measure the voltage present on the voltage bus $V_{BUS}$. Referring to FIG. 3, the voltage divider 305 is connected to the voltage bus $V_{BUS}$ 303. The voltage divider 305 includes a first resistor 320a with resistance $R_1$ and a second resistor 320b with resistance $R_2$ that, together, reduce the first voltage signal from the voltage on the voltage bus $V_{BUS}$ to a second voltage signal present at node 307. For example, the first voltage signal at node 307 may be reduced from ~15 V present on $V_{BUS}$ to a reduced, second voltage signal of 1.8 V. The power monitoring system 108 can use the second voltage signal received at node 307 to compute the voltage on the voltage bus $V_{BUS}$ based on the resistance values $R_1$ and $R_2$ used in the voltage divider 305. Accordingly, by using voltage divider 305, the voltage measured by the power monitoring system 108 is reduced, thereby reducing system complexity and cost.

In some examples, the power monitoring system 108 can configure a gain 322 of an amplifier used to amplify the current signal and generate an amplified current signal. Additionally, the power monitoring system 108 can sample the voltage information at node 307 and current information at various sampling rates. The power monitoring system 108 can determine a power consumption value of the electronic system 106 based on the current information and the voltage information. The power consumption value can be transmitted to the electronic system 106 via the data communication bus 114. The electronic system 106 can determine a power state of the electronic system 106 based on the power consumption value. In some examples, the gain 322 and the sampling rate 324 may not be optimized for the power state. Thus, the electronic system 106 can determine and implement adjustments to the gain 322 and/or the sampling rate 324. In some examples, the electronic system 106 determines the power state or the adjustment to the gain 322 and/or the sampling rate 324 by inputting the power consumption value into an algorithm. The electronic system 106 can determine the power state or the adjustment based on an output generated by the algorithm.

The electronic system 106 can output configuration data indicating the adjustment to the gain 322 and/or the sampling rate 324 using the control communication bus 116. Configuration data transmitted using the control communication bus 116 can be used by the power monitoring system 108 to configure the gain 322 and/or the sampling rate 324 of the power monitoring system 108 based on the configuration data. The gain 322 and/or the sampling rate 324 can be continuously tuned as the power monitoring system 108 sends power consumption values to the electronic system 106 and receives configuration data from the electronic system 106.

Figure 4:
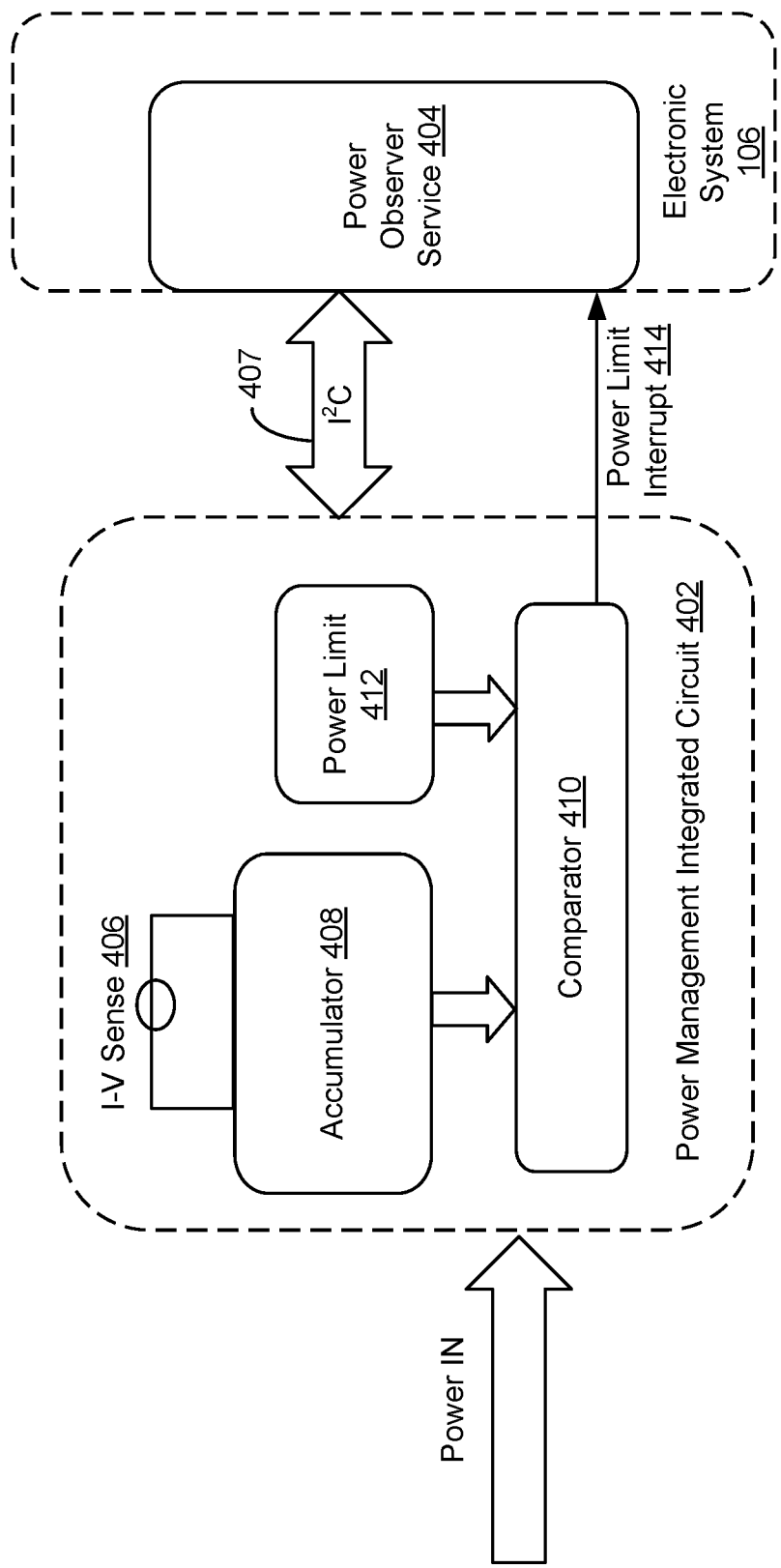
FIG. 4 illustrates an example of a power management integrated circuit and an electronic system in the device, according to some embodiments of the present disclosure.

FIG. 4 illustrates an example of a power management integrated circuit 402 and the electronic system 106 in the device 100 of FIG. 1, according to some embodiments of the present disclosure. Because the power monitoring system 108 depicted in FIGS. 1 and 3 can have current sensing on the low-side using low-voltage rated devices, the power monitoring system 108 can be integrated into the power management integrated circuit 402. Operation at low-voltage levels can simplify system level connections between the electronic system 106 and other power integrated circuits in the device 100. The power management integrated circuit 402 can use the power monitoring system 108 to provide a power limiting functionality.

As illustrated in FIG. 4, the power management integrated circuit 402 can include components of the power monitoring system 108. These components can include an I-V sense 406, an accumulator 408, and a comparator 410. The I-V sense 406 can be an example of the voltage measurement circuit 110 and the current measurement circuit 112 depicted in FIG. 1 (also illustrated by the voltage divider 305 and current sense resistor 311 in FIG. 3). The accumulator 408 can determine the power consumption value from current information and voltage information measured by the I-V sense 406.

The electronic system 106 can include a power observer service 404 that can set a power limit 412 for the device 100. The power limit 412 can be communicated to the power management integrated circuit 402 over an I²C bus 407, which can be an implementation of control communication bus 116 illustrated in FIG. 3. In an example, the power limit 412 can be 20 W, 25 W, or the like. The comparator 410 can monitor the power consumption values determined by a power register in power management integrated circuit 402 or accumulator 408. When a power consumption value exceeds the power limit 412 or an average power consumption value over a predefined time period exceeds the power limit 412, the comparator 410 can issue a power interrupt 414 to the power observer service 404. The power interrupt 414 can be communicated to the electronic system over data communication bus 114 illustrated in FIG. 3. The power observer service 404 can perform corrective actions to bring the power consumption of the device 100 back to safe regions. This can act as a guardrail for power consumption for the device by quickly alerting the electronic system 106 when the power limit 412 is exceeded.

In some examples, the power observer service 404 can set the power limit 412 as a main trigger point. The power observer service 404 can use a single-fault safety mechanism algorithm to leverage this feature. In the event of repeated violations (e.g., exceeding the power limit 412 repeatedly), the power observer service 404 can shut down or limit operation of components of the electronic system 106. This can avoid catastrophic failures such as triggering power breakouts or excessive heating. The power limit 412 can also be set to remotely perform root cause analysis of components or subsystem failures resulting from aging, ambient temperature variations, unpredicted use cases, or out of specification components. This feature can provide information on peak power usage and distribution across multiple devices. The data can be used to reduce unwanted headroom in power delivery systems and save significant product bill of materials cost.

Figure 5:
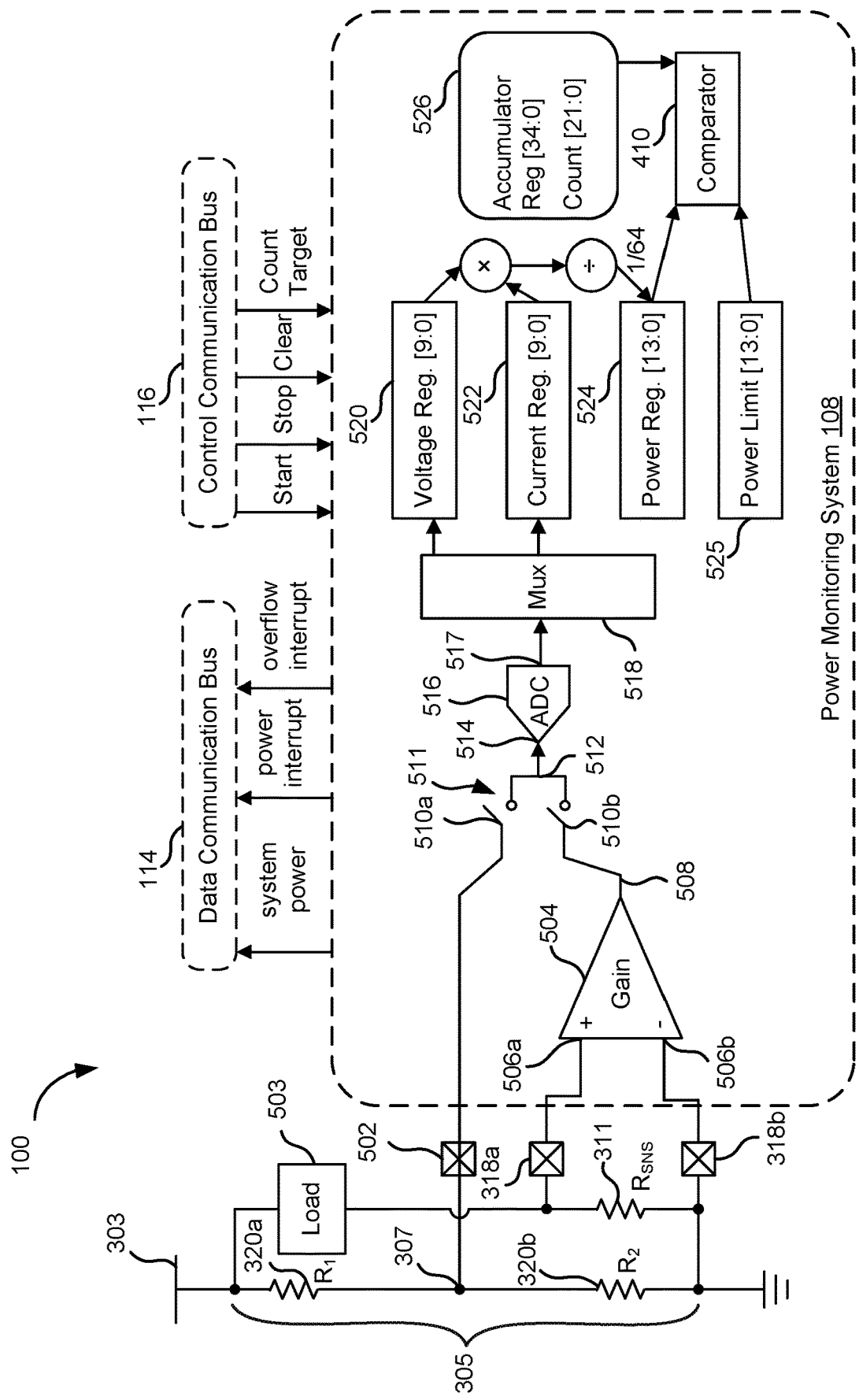
FIG. 5 illustrates another example of a circuit implementation of the configurable power monitoring system for the device, according to some embodiments of the present disclosure.

FIG. 5 illustrates another example of a circuit implementation of the power monitoring system 108 for the device 100 of FIG. 1, according to some embodiments of the present disclosure. As illustrated in FIG. 5, the device 100 can include a power monitoring system 108 (e.g., including elements of the power management integrated circuit 402 depicted in FIG. 4) that can monitor the power consumption of electronic system 106 illustrated in FIGS. 1 and 3. The device 100 can also include a voltage divider 305 that can receive a first voltage signal present on a voltage bus $V_{BUS}$ 303. The voltage divider 305 can reduce the first voltage signal present on the voltage bus $V_{BUS}$ 303 using the first resistor 320a having a resistance of $R_1$ and the second resistor 320b having a resistance of $R_2$ and output a second voltage signal at a port 502 connected to node 307. The second voltage signal can be less than the first voltage signal. The voltage bus $V_{BUS}$ 303 can also provide the voltage present on a voltage bus $V_{BUS}$ 303 to a load 503, which represents various components of the device 100, for example, the DC-to-DC buck converter 304, the electronic components controller 310, and the electronic system 106 illustrated in FIG. 3. The current flowing through the load 503 can be detected using a current sense resistor 311. The current sense resistor 311 can include a first end connected to a positive current lead 318a and a second end connected to a negative current lead 318b that is connected to system ground.

As illustrated in FIG. 5, the power monitoring system 108 includes an amplifier 504, a switch 511, an analog-to-digital converter 516, a multiplexer/demultiplexer 518, a voltage register 520, a current register 522, a power register 524, an accumulator register 526, a power limit register 525, and a comparator 410. The amplifier 504 can include a first amplifier input terminal 506a that can connect to the port 318a and the first end of the current sense resistor 311 and a second amplifier input terminal 506b that can connect to negative current lead 318b and the second end of the current sense resistor 311. The amplifier 504 can thus detect and amplify the voltage signal present at the first amplifier input terminal 506a and the second amplifier input terminal 506b. This third voltage signal corresponds to the current flowing through the load 503 and the current sense resistor 311.

Additionally, the amplifier 504 can amplify the third voltage signal to generate an amplified voltage signal. Reference is made to an amplified voltage signal since the voltage signal produced by the amplifier 504 corresponds to current flow through the current sense resistor 311. The amplifier 504 may produce the amplified voltage signal using various gain settings. For example, the amplifier 504 may set the gain to 15×, 30×, 60×, 100×, or the like. In some implementations, the gain is set at a level less than 15× or at a level greater than 100×. Moreover, the gain value can be set at fewer than four levels or more than four levels. One of ordinary skill in the art would recognize many variations, modifications, and alternatives. The gain can be configured by the electronic system 106 illustrated in FIGS. 1, 3, and 4 as described more fully herein. The amplifier 504 also includes an amplifier output terminal 508 at which the amplified current signal can be output.

One example of an analog-to-digital converter 516 can be a 10-bit successive approximation register analog-to-digital converter. The analog-to-digital converter 516 can sample the second voltage signal and the amplified voltage signal at different times via the switch 511. For example, the switch 511 includes a first switch input terminal 510a connected to the port 502 of the voltage divider 305 and a second switch input terminal 510b connected to the amplifier output terminal 508 of the amplifier 504. The switch 511 also includes a switch output terminal 512 connected to an analog-to-digital converter input terminal 514 of the analog-to-digital converter 516. The switch 511 can switch in order to provide a connection between the voltage divider 305 and the analog-to-digital converter 516 or between the amplifier output terminal 508 and the analog-to-digital converter 516. Thus, in a first operating state, the switch 511 can close the first switch input terminal 510a to connect the analog-to-digital converter input terminal 514 to the port 502 of the voltage divider 305. Alternatively, in a second operating state, the switch 511 can close the second switch input terminal 510b to connect the analog-to-digital converter input terminal 514 to the amplifier output terminal 508 of the amplifier 504.

During operation, the switch 511 can be operated in the first operating state in which the first switch input terminal 510a is closed and the analog-to-digital converter input terminal 514 is connected to port 502. In this first state, the analog-to-digital converter 516 can sample the second voltage signal present at port 502 and convert the second voltage signal into voltage information. When the switch 511 is operated in the second operating state, the second switch input terminal 510b is closed and the analog-to-digital converter input terminal 514 is connected to the amplifier output terminal 508 of the amplifier 504. In this second state, the analog-to-digital converter 516 can sample the amplified voltage signal produced by amplifier 504 and convert the amplified voltage signal into current information. The first operating state and the second operating state can be utilized in an alternating manner.

Thus, using the switch 511, the analog-to-digital converter 516 can alternately sample the second voltage signal or the amplified voltage signal to produce the voltage information or the current information. The sampling rate, also referred to as the sampling frequency, and sample duration of the analog-to-digital converter 516 can be configured by the electronic system 106. In an example, the sampling rate can range from 1 Hz to 20 kHz. The sample duration can be on the order of 5 us for voltage sampling and 5 us for current sampling. Thus, the sampling period can be configured over a wide range and involve sampling either voltage information or current information every 50 μs, every 1 second, or the like. The analog-to-digital converter 516 can output the voltage information or the current information to the multiplexer/demultiplexer 518 via an analog-to-digital converter output terminal 517.

When the analog-to-digital converter 516 produces the voltage information in the first operating state, the multiplexer/demultiplexer 518 can deliver the voltage information to the voltage register 520 for storage. When the analog-to-digital converter 516 produces the current information in the second operating state, the multiplexer/demultiplexer 518 can deliver the current information to the current register 522 for storage. In this embodiment in which the analog-to-digital converter 516 switches between operating states, the multiplexer/demultiplexer 518 can route the signals between the different registers discussed herein. In other embodiments, the multiplexer/demultiplexer 518 can multiplex the signals together to be demultiplexed later. The voltage information stored in the voltage register 520 can be multiplied by the current information stored in the current register 522 to produce power information. In the embodiment illustrated in FIG. 5, the power information is scaled by a factor (e.g., a factor of 64) and the resulting scaled power information is stored in the power register 524.

The accumulator register 526 can be connected to the power register 524 to accumulate the scaled power information and produce a system power corresponding to the electronic system 106. The accumulator register 526 can transmit the system power to the electronic system 106 using the data communication bus 114. Accordingly, the accumulator register 526 enables the scaled power information stored in the power register 524 to be integrated over time to provide a system energy level. Concurrently, the comparator 410 can monitor the scaled power information stored in the power register 524. If the scaled power signal exceeds the power limit stored in the power limit register 525, which is set by the electronic system 106 as discussed in relation to FIG. 4, the comparator 410 can generate a power interrupt signal that can be transmitted to the electronic system 106 using the data communication bus 114.

Communication from the power monitoring system 108 to the electronic system 106 is represented by data communication bus 114. As illustrated in FIG. 5, data that can be communicated using data communication bus 114 includes system power provided by accumulator register 526 and/or a power interrupt signal that can be generated based on the comparator 410 determining that the power limit stored in the power limit register 412 has been exceeded. Also, as described more fully herein, overflow interrupt signals can be transmitted using data communication bus 114 for conditions in which register values indicate that saturation of the register is being approached. Additional description related to the use of data communication bus 114 is provided in relation to FIG. 6A.

Communication from the electronic system 106 to the power monitoring system 108 is represented by control communication bus 116. As illustrated in FIG. 5, control communications can include starting or stopping (e.g., pausing) the operation of power monitoring system 108 (i.e., start, stop) or clearing of registers included in power monitoring system 108 (i.e., clear). Additionally, a count target can be communicated using control communication bus 116, for example, the count target used by accumulator register 526. The gain of the amplifier 504 can be set based on configuration data received by the power monitoring system 108 from the electronic system 106 over the control communication bus 116. Additional description related to the use of control communication bus 116 is provided in relation to FIG. 6B.

The electronic system 106 can determine a power state of the device 100 based on the system power. Based on the power state, the electronic system 106 can generate configuration data. The electronic system 106 can transmit the configuration data to the power monitoring system 108 using the control communication bus 116. Thus, the power monitoring system 108 can be adjusted based on the configuration data. For example, at a first time, the device 100 can begin operation in the medium power state. The resolution and the dynamic range of current sensing can be set to 20 mA and 3 A, respectively. At a second time, the electronic system 106 may determine, based on system power received from the accumulator register 526, that the device 100 has moved into the low-power state. The electronic system 106 can therefore generate configuration data that sets the gain to 60× and the resolution and dynamic range to <10 mA and 1.5 A, respectively. At a third time, the electronic system 106 may determine, based on system power received from the accumulator register 526, that the device 100 has moved into the ultra-low power state (e.g., a hibernation mode). The electronic system 106 can therefore generate configuration data that sets the gain to 100×, improves the resolution to <5 mA, and sets the dynamic range to <1 A. Because the device 100 is in the hibernation mode, most of the electronic system 106 can be shut down. The relatively high resolution can be useful to capture the "sleep mode" power consumption.

On the other hand, when the device 100 becomes active again at a fourth time and the electronic system 106 determines, based on the system power, that the device 100 is in the high-power state, the electronic system 106 can generate configuration data that reduces the gain to 15×. As a result, the dynamic range can be increased to 6 A and the resolution can be set at 20 mA. This relatively high resolution value may not create much inaccuracy because the current consumption is typically less than 1 A with negligible error.

The configuration data generated by the electronic system 106 can also configure the sampling rate and sampling duration. If the sampling rate is relatively high, such as 50 kHz, the total number of samples over 1 second is 50,000. If the entire sampling duration (e.g., total sampling period) is 5 minutes, 15,000,000 samples can be accumulated. The power register 524 and the accumulator register 526 may utilize a significant amount of storage space to store the power information and the system power without running into overflow issues. Thus, it may be difficult to use a high sampling rate while stretching the sampling duration to hours or even days. On the other hand, if it is desirable to record the system power values for hours, the sampling rate may be reduced.

When the electronic system 106 determines, based on the system power, that the device 100 is in the high-power state, the electronic system 106 may generate configuration data that sets the sampling rate to be relatively high. This can allow the power monitoring system 108 to capture transient power peaks. The sampling duration does not have to be relatively long, as the electronic system 106 can read out the system power from the accumulator register 526 relatively frequently. Thus, the accumulator register 526 may not have to store the system power for long periods of time. For example, once the system power is read by the electronic system 106, internal storage of the accumulator register 526 and the power register 524 can be reset.

On the other hand, when the electronic system 106 determines that the device 100 is in the ultra-low power state, the electronic system 106 itself may be in sleep mode and may not wake up for hours. Thus, the configuration data can set the sampling duration to be relatively longer (e.g., several hours). As there is not much activity in the ultra-low power state, the sampling rate can be reduced drastically as there is little to no fluctuation to the system power over time due to no activity. The sampling rate can be configured to 100 ms. In this way, it can be useful to configure the sampling duration and the sampling rate of the analog-to-digital converter 516 based on the power state of the device 100. Additionally, the sampling duration and sampling rate can be configured at the beginning of each power-state transition, depending on the requirements of the device 100.

In some examples, the bit count for the voltage register 520, the current register 522, the power register 524, and the accumulator register 526 can be monitored, for example by data transmitted from the power monitoring system 108 to the electronic system 106 using the data communication bus 114 as illustrated in FIGS. 1 and 3. If the bit count exceeds a bit count threshold set by the electronic system 106, the data communication bus 114 can be used to transmit an overflow interrupt to the electronic system 106. The electronic system 106 can generate updated configuration data based on the overflow interrupt. For example, the updated configuration data can include reducing the sampling rate to accumulate less samples.

Figure 6A:
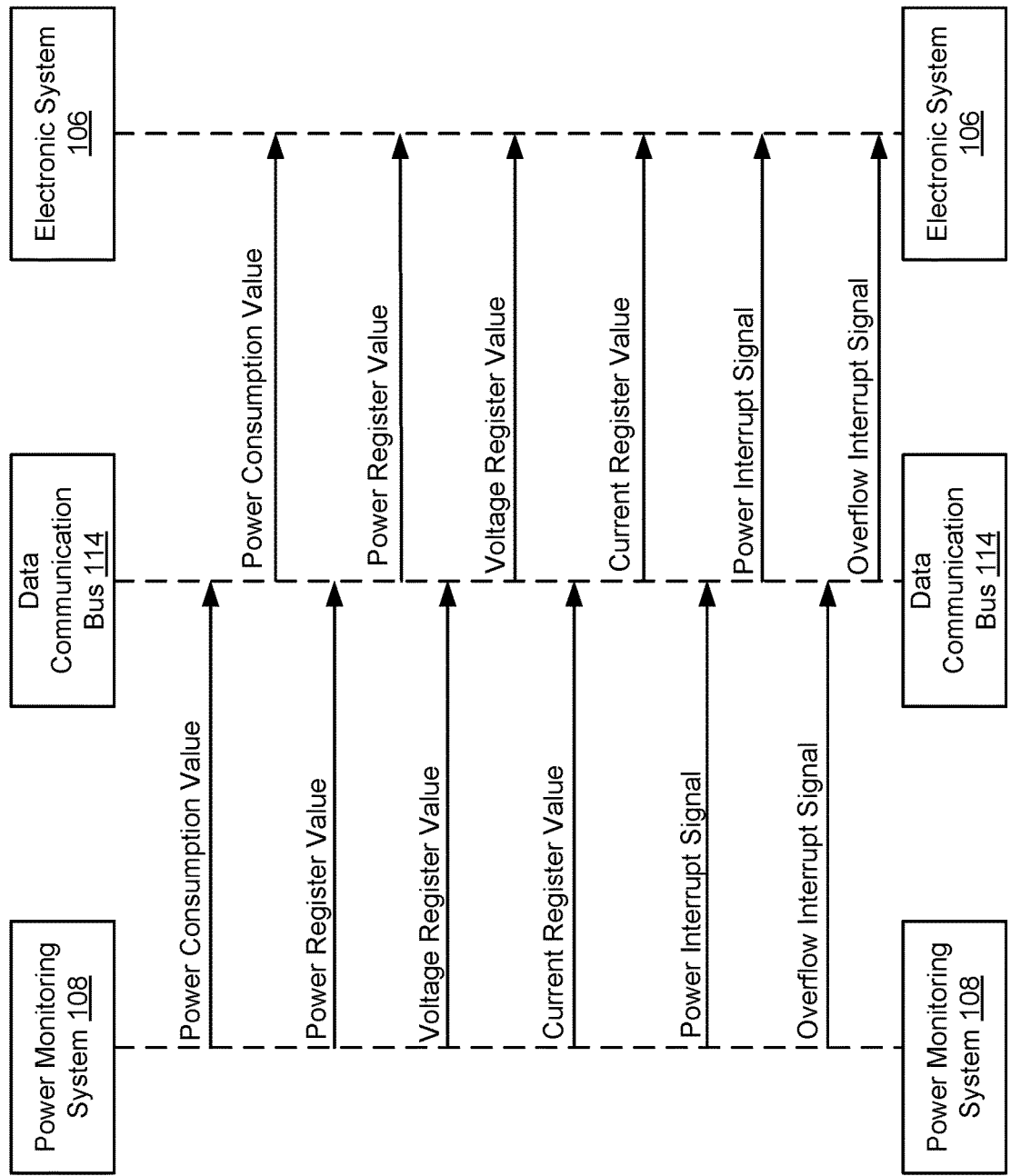
FIG. 6A illustrates an example of a sequence diagram of data flow from the power monitoring system to the electronic system, according to some embodiments of the present disclosure.

FIG. 6A illustrates an example of a sequence diagram of data flow from the power monitoring system 108 to the electronic system 106, according to some embodiments of the present disclosure. The power monitoring system 108 is coupled to the electronic system 106 and can detect a current flowing through the electronic system 106. The power monitoring system 108 can monitor power consumption of the electronic system 106 by measuring a voltage and current corresponding to the electronic system 106. For example, the power monitoring system 108 can sample voltage information and current information corresponding to the electronic system 106. The power monitoring system 108 can store the voltage information in a voltage register and the current information in a current register. Then, the power monitoring system 108 can determine power information by multiplying the voltage information by the current information. The power information can be stored in a power register. The power monitoring system 108 can determine a power consumption value for the electronic system 106 based on the power information. The power consumption value can be stored in an accumulator register. The power monitoring system 108 can monitor power consumption for the electronic system 106 at different configurations, such as different gains, sampling rates, sampling durations, sensing ranges, and sensing accuracies. Thus, the power monitoring system 108 can determine the power consumption value by sampling at a first gain, a first sampling rate, and for a first sampling duration.

The power monitoring system 108 can transmit the power consumption value to the electronic system 106 using a data communication bus 114. In some examples, the power monitoring system 108 may also transmit a power register value (e.g., a value of the power information), a voltage register value (e.g., a value of the voltage information) and a current register value (e.g., a value of the current information) to the electronic system 106 using the data communication bus 114. The electronic system 106 can use the power consumption value (and in some examples, the power register value, the voltage register value, and the digital current register value) to determine a power state for the device. The power state can be one of several predefined power states that represent different operating modes for the device 100, based on the power consumption. It may be advantageous for the power monitoring system 108 to measure the power consumption values with different accuracies or sensing ranges for different power states.

In some examples, the power monitoring system 108 may utilize a power limit. The power limit may be predetermined and set by the electronic system 106 to alert the electronic system 106 of the device 100 overheating or potentially becoming damaged from consuming too much power. Then, each time the power monitoring system 108 determines a power consumption value for the electronic system 106, the power monitoring system 108 can compare the power consumption value to the power limit. If the power consumption value exceeds the power limit, the power monitoring system 108 can generate a power interrupt signal that is transmitted to the electronic system 106 using the data communication bus 114. The power interrupt signal can prompt the electronic system 106 to perform corrective actions to bring the power consumption of the device 100 back to safe regions. For example, the electronic system 106 can lower an audio volume produced by a speaker in the device 100. Alternatively, the electronic system 106 can enter a shutdown mode until the device 100 cools down to an acceptable temperature.

The power monitoring system 108 can include the accumulator register storing power consumption values, the power register storing power register values, the voltage register storing voltage register values, and the current register storing current register values. Each of the registers may store a certain number of values (e.g., a bit count threshold) that is set by the electronic system 106. The power monitoring system 108 can monitor bit counts for each of the voltage register, the current register, the power register, and the accumulator register. If the bit counts for any of the registers exceeds the bit count threshold, the power monitoring system 108 can generate an overflow interrupt signal.

The power monitoring system 108 can transmit the overflow interrupt signal to the electronic system 106 using the data communication bus 114. The overflow interrupt signal can prompt the electronic system 106 to determine adjustments to the configuration of the power monitoring system 108. For example, exceeding the bit count threshold may indicate that the sampling rate of the power monitoring system is too high, and is therefore generating too many samples.

Figure 6B:
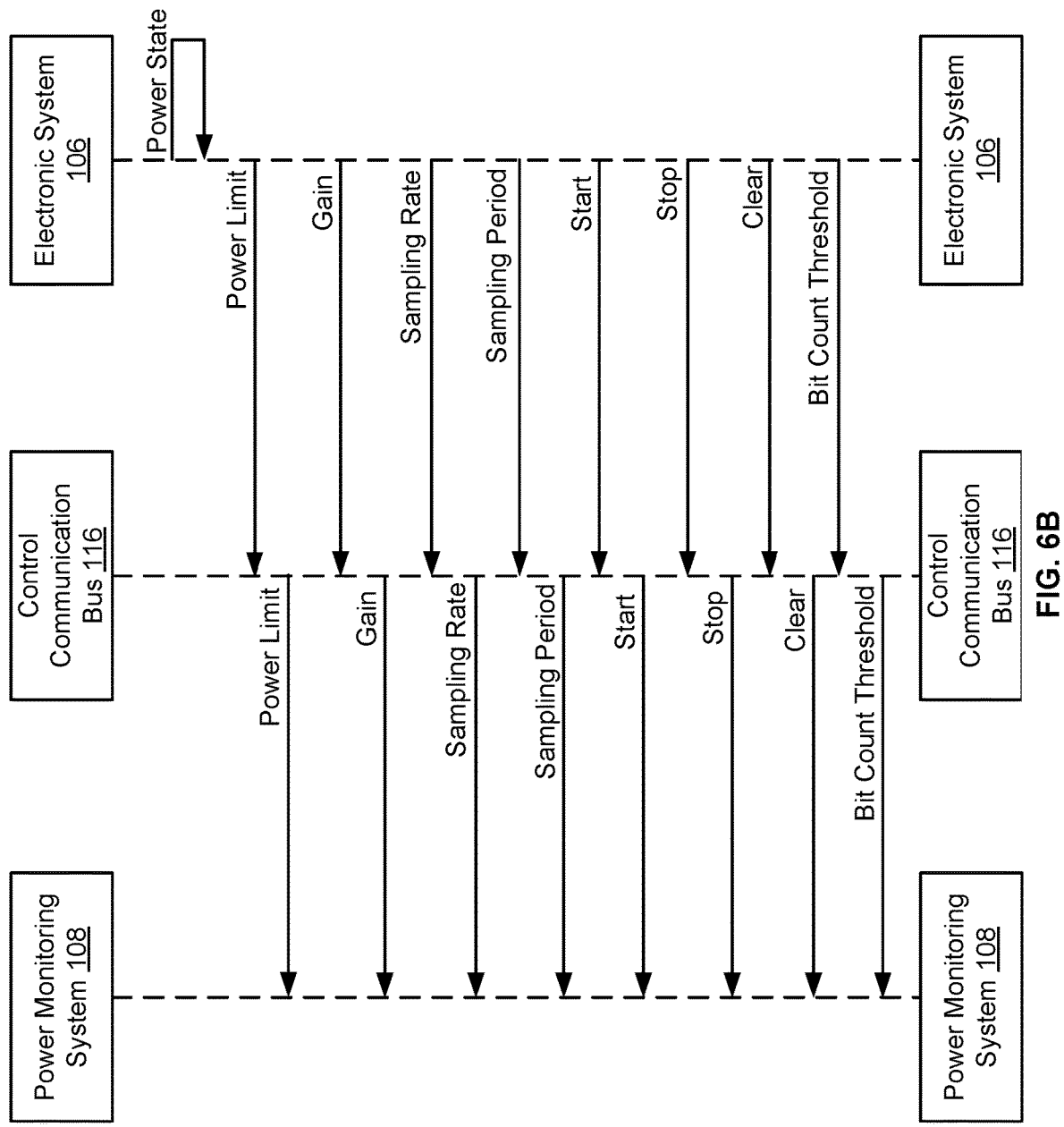
FIG. 6B illustrates an example of a sequence diagram of data flow from the electronic system to the power monitoring system, according to some embodiments of the present disclosure.

FIG. 6B illustrates an example of a sequence diagram of data flow from the electronic system 106 to the power monitoring system 108, according to some embodiments of the present disclosure. The electronic system 106 can determine a power state of the device 100 based on the power consumption value received from the power monitoring system 108. The electronic system 106 can determine whether the current configuration of the power monitoring system 108 is appropriate for the current power state. If the configuration of the power monitoring system 108 is not appropriate (e.g., optimized) for the current power state, the electronic system 106 can generate configuration data to cause the power monitoring system to adjust its configuration. For example, the electronic system 106 may determine that the power consumption value indicates that the electronic system 106 has changed from a high-power state to a relatively low power state. Therefore, the electronic system 106 can generate configuration data that includes a new gain for the power monitoring system to use when sampling a voltage signal. The electronic system 106 can also generate a new sampling rate and sampling period for the power monitoring system 108 to use based on the power state. The electronic system 106 can transmit the gain, the sampling rate, and the sampling period to the power monitoring system 108 using the control communication bus 116.

The power monitoring system 108 can use the gain, the sampling rate, and the sampling period received from the electronic system 106 over the control communication bus 116 to adjust the configuration of the power monitoring system 108. In this example, the power monitoring system 108 can adjust an amplifier in the power monitoring system 108 to operate at a second gain of 100×. This can restrict the sensing range of the power monitoring system 108 while increasing the sensing accuracy. Additionally, the power monitoring system 108 can adjust the sampling rate and the sampling period of the power monitoring system 108. Thus, the power monitoring system 108 can detect power consumption values using a configuration that is optimized for the current power state. As the power monitoring system 108 continues to send power consumption values to the electronic system 106 via the data communication bus 114, the electronic system 106 can generate additional configuration data to perform additional configuration adjustments for the power monitoring system 108 as the power states continue to change and transmit this additional configuration data using control communication bus 116.

In some examples, the electronic system 106 can determine a power limit for the device 100. The electronic system 106 can transmit the power limit to the power monitoring system 108 using the control communication bus 116.

Each of the registers of the power monitoring system 108 may store a certain number of values. These values can be set by the electronic system 106. For example, the electronic system 106 may generate a bit count threshold for the voltage register, the current register, the power register, and/or the accumulator register. The electronic system 106 can transmit the bit count threshold(s) to the power monitoring system 108 using the control communication bus 116. The power monitoring system 108 can then set the bit count threshold for the voltage register, the current register, the power register, and/or the accumulator register. If the bit count threshold is exceeded, the power monitoring system 108 can send an overflow interrupt signal to the electronic system 106 using the data communication bus 114. In response, the electronic system 106 can cause the power monitoring system 108 to reduce the sampling rate. Alternatively, the electronic system 106 can increase the bit count threshold(s) used by the power monitoring system 108. The electronic system 106 can then transmit the new bit count threshold(s) to the power monitoring system 108 using the control communication bus 116 for adjustment of the bit count threshold(s) by the power monitoring system 108.

In some examples, the electronic system 106 may start or stop (e.g., pause) operation of the power monitoring system 108 by sending start or stop commands using the control communication bus 116. In response, the power monitoring system 108 can start or stop the measurement of power consumption values corresponding to the electronic system 106. For example, the electronic system 106 can start, stop (e.g., pause), or clear the registers included in the power monitoring system 108. For example, the electronic system 106 can send a start command using the control communication bus 116 that can be used by the power monitoring system 108 to start measurement and storage of power consumption values in the accumulator register. Then, the electronic system 106 can send a stop command using the control communication bus 116 that can be used by the power monitoring system 108 to stop measurement and storage of power consumption values in the accumulator register. In some cases, the accumulator register (and/or other registers in the power monitoring system 108) may store values that may no longer be needed. In this case, the electronic system 106 can send a clear command using the control communication bus 116 that can cause the values stored in the accumulator register, the power register, the current register, and/or the voltage register to be cleared.

Figure 7:
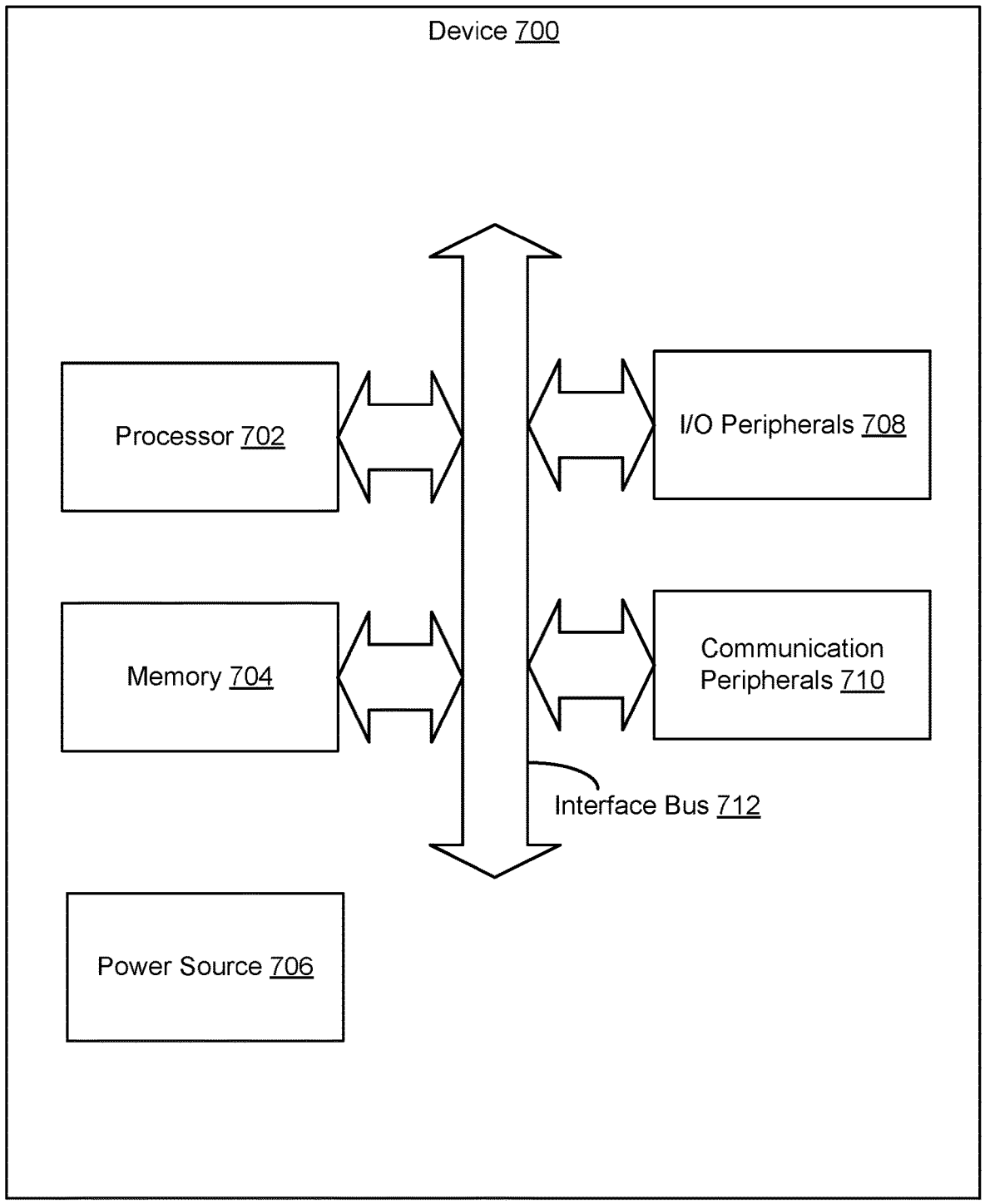
FIG. 7 illustrates an example of components of the device, according to embodiments of the present disclosure.

FIG. 7 illustrates examples of components of a device 700, according to embodiments of the present disclosure. The device 700 is an example of the device described in connection with the above figures.

In an example, the device 700 includes at least a processor 702, a memory 704, a power source 706, input/output (I/O) peripherals 708, communication peripherals 710, and an interface bus 712. The interface bus 712 is configured to communicate, transmit, and transfer data, controls, and commands among the various components of the device 700. The memory 704 may include computer-readable storage media, such as RAM, ROM, electrically erasable programmable read-only memory (EEPROM), hard drives, CD-ROMs, optical storage devices, magnetic storage devices, electronic non-volatile computer storage, for example Flash® memory, and other tangible storage media. Any of such computer readable storage media can be configured to store instructions or program codes embodying aspects of the disclosure. The memory 704 may also include computer readable signal media. A computer readable signal medium includes a propagated data signal with computer readable program code embodied therein. Such a propagated signal takes any of a variety of forms including, but not limited to, electromagnetic, optical, or any combination thereof. A computer readable signal medium includes any computer readable medium that is not a computer readable storage medium and that can communicate, propagate, or transport a program for use in connection with the device 700.

The power source 706 may include an internal power source for the device, such as a set of batteries in series. The I/O peripherals 708 can include user interfaces, such as a keyboard, screen (e.g., a touch screen), microphone, audio processing circuitry (e.g. speaker, power converter, audio amplifier, etc. as described in connection with the above figures), other input/output devices, and computing components, such as graphical processing units, serial ports, parallel ports, universal serial buses, and other input/output peripherals. The I/O peripherals 708 are connected to the processor 702 through any of the ports coupled to the interface bus 712. The communication peripherals 710 are configured to facilitate communication between the device 700 and other computing devices over a communications network and include, for example, a network interface controller, modem, wireless and wired interface cards, antenna, and other communication peripherals.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or network browser. It should be appreciated that alternate embodiments may have numerous variations from that described above. For example, customized hardware might also be used and/or particular elements might be implemented in hardware, software (including mobile software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The various illustrative logical blocks and modules described in connection with the embodiments disclosed herein can be implemented or performed by a machine, such as a general purpose processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a mobile computing device, a device controller, or a computational engine within an appliance, to name a few.

Figure 8:
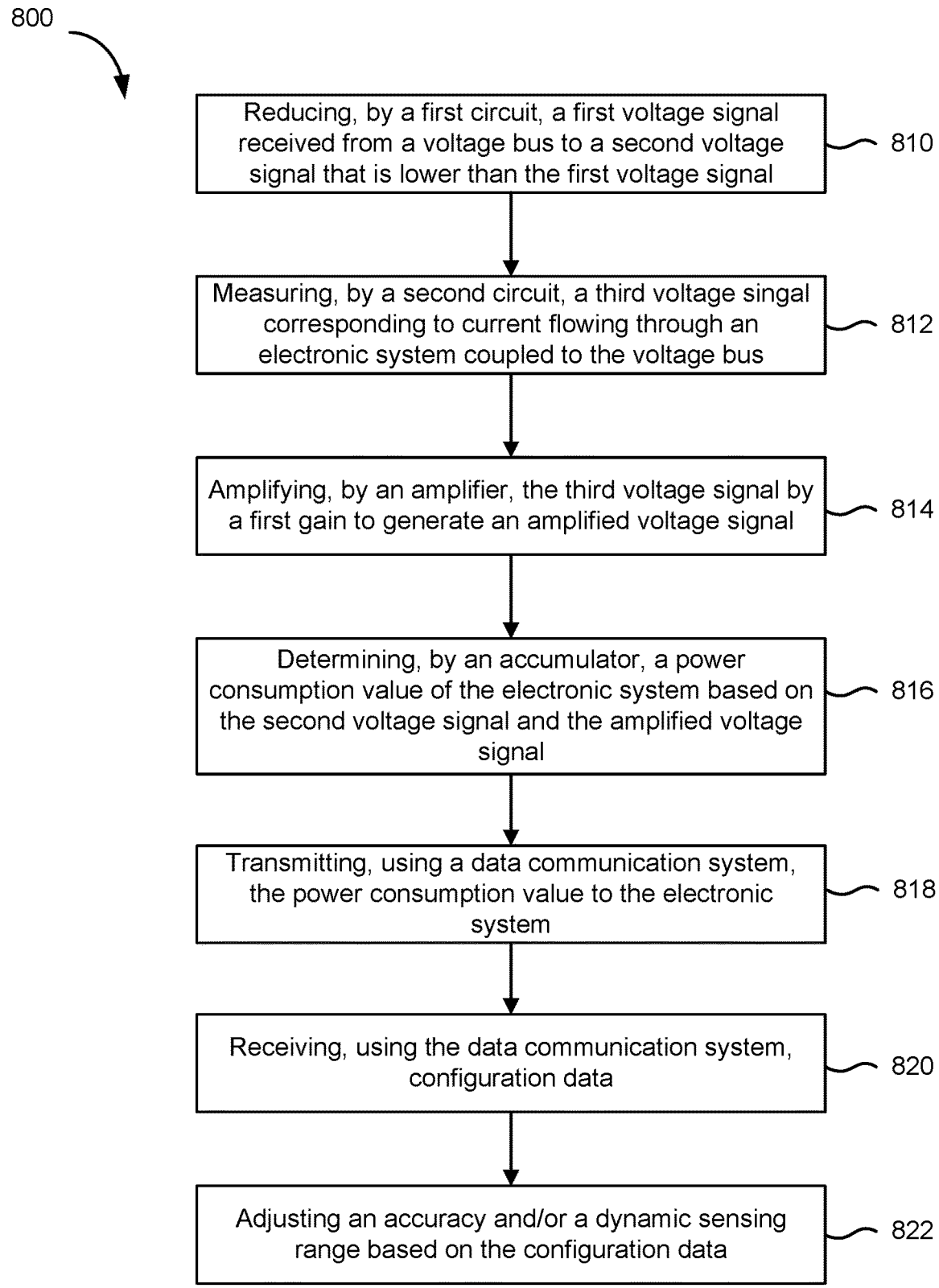
FIG. 8 is a flowchart illustrating a method of configuring power monitoring in the device, according to embodiments of the present disclosure.

FIG. 8 is a flowchart illustrating a method 800 of configuring power monitoring in a device, according to embodiments of the present disclosure. The method can be implemented by a device, for example, an electronic device. In an example, the method 800 includes operation 810, where a first circuit reduces a first voltage signal received from a voltage bus to a second voltage signal that has a lower voltage than the first voltage signal. In some examples, the first circuit can be a voltage measurement circuit. A switch can input the second voltage signal into an analog-to-digital converter. The analog-to-digital converter can sample the second voltage signal for a first time period at a first sampling rate to produce voltage information.

In an example, the method 800 includes operation 812, where a second circuit measures a third voltage signal corresponding to current flowing through an electronic system coupled to the voltage bus. In some examples, the second circuit can be a current measurement circuit.

In an example, the method 800 includes operation 814, where an amplifier amplifies the third voltage signal by a first gain to generate an amplified voltage signal corresponding to the current flow through the electronic system. The switch can input the amplified voltage signal into the analog-to-digital converter. The analog-to-digital converter can sample the amplified voltage signal for a second time period at the first sampling rate to produce current information.

In an example, the method 800 includes operation 816, where an accumulator determines a power consumption value of the electronic system based on the second voltage signal and the amplified voltage signal. For example, a demultiplexer connected to the analog-to-digital converter can deliver the voltage information to a voltage register for storage in the voltage register. The demultiplexer can also deliver the current information to a current register for storage in the current register. The power register can compute power information by multiplying the voltage information with the current information. The power register can store the power information in the power register. The accumulator can determine the power consumption value of the electronic system based on the power information. The accumulator can store the power consumption value in an accumulator register.

In some examples, the electronic system can transmit a bit count threshold for the current register, the voltage register, the power register, and/or the accumulator register to the accumulator. The data communication system can determine that a bit count for at least one of the current register, the voltage register, the power register, or the accumulator register exceeds the bit count threshold. In response to determining that the bit count exceeds the bit count threshold, the data communication system can be used to transmit an overflow interrupt signal to the electronic system. The electronic system can generate updated configuration data comprising a command to adjust at least one of the gain of the amplifier or a sampling rate of the analog-to-digital converter based at least in part on the overflow interrupt signal. The electronic system can transmit the updated configuration data using the data communication system.

In other examples, a comparator can compare the power consumption value to a power limit. The comparator can detect that the power consumption value exceeds the power limit. In response to detecting that the power consumption value exceeds the predefined power limit, the data communication system can be used to transmit a power interrupt signal to the electronic system. The electronic system can generate the updated configuration data based at least in part on the power interrupt signal.

In an example, the method 800 includes operation 818, where a data communication system is used to transmit the power consumption value to the electronic system. The electronic system can determine a power state of the electronic system based on the power consumption value. For example, the electronic system can input the power consumption value into an algorithm. The electronic system can receive an output generated based on the power consumption value from the algorithm. The electronic system can determine the power state based, at least in part, on the output of the algorithm. Then, the electronic system can determine the configuration data by determining an adjustment to the gain of the amplifier based, at least in part, on the power state of the electronic system. Additionally or alternatively, the electronic system can determine the configuration data by determining an adjustment to be made to the analog-to-digital converter to modify operation from the first sampling rate to a second sampling rate based, at least in part, on the power state of the electronic system.

In an example, the method 800 includes operation 820, where the data communication system is used to receive the configuration data subsequent to transmission of the power consumption value.

In an example, the method 800 includes operation 822, where an accuracy and/or a dynamic range of the device is adjusted based on the configuration data. For example, a gain of the amplifier may be adjusted based on the configuration data. Additionally, the sampling rate of the analog-to-digital converter may be adjusted based on the configuration data. For example, in response to receiving the configuration data, the analog-to-digital converter can sample the reduced voltage for a third time period at the second sampling rate. Additionally, the analog-to-digital converter can sample the amplified current signal for a fourth time period at the second sampling rate.

It should be appreciated that the specific steps illustrated in FIG. 8 provide a particular method of configuring a power monitoring system for an electronic device according to an embodiment of the present disclosure. Other sequences of steps may also be performed according to alternative embodiments. For example, alternative embodiments of the present disclosure may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A system comprising:
   a voltage divider configured to receive a first voltage signal from a voltage bus and output a second voltage signal at an output port, wherein the second voltage signal is lower than the first voltage signal;
   a current sense resistor coupled to the voltage bus, wherein a first end of the current sense resistor is configured to output a positive output voltage signal and a second end of the current sense resistor is connected to ground;
   an amplifier comprising:
      a first amplifier input terminal connected to the first end of the current sense resistor; and
      a second amplifier input terminal connected to ground; and
      an amplifier output terminal;
   a switch comprising:
      a first switch input terminal connected to the output port of the voltage divider;
      a second switch input terminal connected to the amplifier output terminal of the amplifier; and
      a switch output terminal;
   an analog-to-digital converter (ADC) comprising an ADC input terminal connected to the switch output terminal and an ADC output terminal;
   a multiplexer/demultiplexer connected to the ADC output terminal and configured to store, in a first operating state, voltage information in a voltage register and, in a second operating state, current information in a current register;
   a power register coupled to the voltage register and the current register and configured to store power information computed based on the voltage information and the current information;
   an accumulator connected to the power register and configured to determine a system power corresponding to the voltage bus based on the power information; and
   an electronic system coupled to the voltage bus and configured to compute configuration data based on the system power, wherein:
      the amplifier is operable to adjust a gain of the amplifier based on the configuration data; and
   the ADC is operable to adjust a sampling rate of the ADC based on the configuration data.

2. The system of claim 1, wherein:
   with the switch in a first state, the ADC is operable to convert the second voltage signal to the voltage information at the sampling rate; and
   with the switch in a second state, the analog-to-digital converter is operable to convert the positive output voltage signal to the current information at the sampling rate.

3. The system of claim 1, further comprising:
   a data communication bus configured to transmit the system power to the electronic system; and
   a control communication bus configured to receive the configuration data from the electronic system.

4. A device comprising:
   a first circuit configured to receive a first voltage signal from a voltage bus and output a second voltage signal that has a lower voltage than the first voltage signal;
   an electronic system coupled to the voltage bus;

a second circuit coupled to the electronic system and configured to output a third voltage signal corresponding to current flow through the electronic system;
an amplifier configured to amplify the third voltage signal by a first gain to generate an amplified voltage signal;
an accumulator configured to determine a power consumption value of the electronic system based on the second voltage signal and the amplified voltage signal; and
a data communication system configured to:
 transmit the power consumption value to the electronic system; and
 receive configuration data from the electronic system, the configuration data including a second gain different from the first gain.

5. The device of claim 4, wherein the amplifier comprises:
a first amplifier input terminal connected to a first end of the second circuit; and
a second amplifier input terminal connected to ground.

6. The device of claim 4, further comprising:
a switch comprising:
 a first switch input terminal connected to the first circuit, wherein the first circuit comprises a voltage measurement circuit;
 a second switch input terminal connected to an amplifier output terminal of the amplifier; and
 a switch output terminal.

7. The device of claim 4, further comprising:
a switch having a first input terminal, a second input terminal, and a switch output terminal, the switch being coupled to the first circuit and the amplifier;
an analog-to-digital converter (ADC) comprising:
 an ADC input terminal connected to the switch output terminal; and
 an ADC output terminal configured to output:
  in a first operating state in which the first input terminal is connected to the ADC, voltage information based on the second voltage signal; and
  in a second operating state in which the second input terminal is connected to the ADC, current information based on the amplified voltage signal.

8. The device of claim 7, wherein the voltage information or the current information is output at a first sampling rate at a first time, and wherein the data communication system is further configured to receive configuration data operable to adjust the first sampling rate at the ADC output terminal to a second sampling rate at a second time based on the configuration data.

9. The device of claim 7, further comprising:
a multiplexer/demultiplexer connected to the ADC output terminal and configured to store, in the first operating state, the voltage information in a voltage register, and, in the second operating state, the current information in a current register, wherein the data communication system is further configured to receive configuration data operable to adjust a bit count threshold for the voltage register or the current register.

10. The device of claim 4, further comprising:
an analog-to-digital converter (ADC) coupled to the first circuit and the amplifier;
a voltage register coupled to the ADC and configured to store voltage information;
a current register coupled to the ADC and configured to store current information; and
a power register coupled to the voltage register and the current register and configured to store power information computed based on the voltage information and the current information,
wherein the accumulator further comprises:
 an accumulator register configured to store the power information.

11. The device of claim 4, wherein the data communication system further comprises:
a data communication bus connected to the accumulator and configured to transmit the power consumption value to the electronic system; and
a control communication bus configured to receive the configuration data from the electronic system, wherein the amplifier is operable to adjust the first gain to a second gain based on the configuration data.

12. The device of claim 11, further comprising:
a comparator coupled to the accumulator and the data communication bus, the comparator being configured to output a power interrupt signal to the data communication bus in response to detecting that the power consumption value exceeds a power limit value.

13. A method implemented by a device, the method comprising:
reducing, by a first circuit, a first voltage signal received from a voltage bus to a second voltage signal that has a lower voltage than the first voltage signal;
measuring, by a second circuit, a third voltage signal corresponding to current flow through an electronic system coupled to the voltage bus;
amplifying, by an amplifier, the third voltage signal by a first gain to generate an amplified voltage signal;
determining, by an accumulator, a power consumption value of the electronic system based on the second voltage signal and the amplified voltage signal;
transmitting, by a data communication system, the power consumption value to the electronic system;
receiving, by the data communication system, configuration data; and
adjusting, based on the configuration data, at least one of an accuracy or a dynamic range of the device.

14. The method of claim 13, further comprising:
determining, by the electronic system, a power state of the electronic system by:
 inputting the power consumption value into an algorithm;
 receiving, from the algorithm, an output generated based on the power consumption value; and
 determining the power state based, at least in part, on the output of the algorithm; and
determining, by the electronic system, the configuration data by determining an adjustment from the first gain to a second gain of the amplifier based, at least in part, on the power state of the electronic system.

15. The method of claim 13, further comprising:
inputting, using a switch, the second voltage signal into an analog-to-digital converter (ADC);
sampling, by the ADC, the second voltage signal for a first time period at a first sampling rate to produce voltage information;
inputting, using the switch, the amplified voltage signal into the ADC; and
sampling, by the ADC, the amplified voltage signal for a second time period at the first sampling rate to produce current information.

16. The method of claim 15, further comprising:
determining, by the electronic system, an adjustment from the first sampling rate to a second sampling rate based, at least in part, on a power state of the electronic system determined from the power consumption value; and
in response to receiving the configuration data:
sampling, by the ADC, the second voltage signal for a third time period at the second sampling rate; and
sampling, by the ADC, the amplified voltage signal for a fourth time period at the second sampling rate.

17. The method of claim 13, further comprising:
storing voltage information in a voltage register;
storing current information in a current register;
computing, by a power register, power information by multiplying the voltage information by the current information;
storing the power information in the power register;
determining, by the accumulator, the power consumption value of the electronic system based on the power information; and
storing the power consumption value in an accumulator register.

18. The method of claim 17, further comprising:
transmitting, by the electronic system, a bit count threshold for the voltage register, the current register, the power register, or the accumulator register; and
determining, by the data communication system, that a bit count for at least one of the voltage register, the current register, the power register, or the accumulator register exceeds the bit count threshold.

19. The method of claim 17, further comprising:
determining, by the data communication system, that a bit count for at least one of the voltage register, the current register, the power register, or the accumulator register exceeds the bit count threshold;
transmitting, by the data communication system, an overflow interrupt signal to the electronic system;
generating, by the electronic system, updated configuration data comprising at least one of an adjusted gain of the amplifier or an adjusted sampling rate of an ADC based, at 8 least in part, on the overflow interrupt signal; and
transmitting, by the electronic system, the updated configuration data to the data communication system.

20. The method of claim 13, further comprising:
comparing, by a comparator, the power consumption value to a power limit;
detecting, by the comparator, that the power consumption value exceeds the power limit;
in response to detecting that the power consumption value exceeds the power limit, transmitting, by the data communication system, a power interrupt signal to the electronic system; and
generating, by the electronic system, updated configuration data based, at least in part, on the power interrupt signal.

* * * * *